(12) United States Patent
Mun et al.

(10) Patent No.: US 10,658,626 B2
(45) Date of Patent: May 19, 2020

(54) ORGANIC LIGHT EMITTING DEVICE AND MANUFACTURING METHOD THEREOF

(71) Applicant: SAMSUNG DISPLAY CO., LTD., Yongin-Si, Gyeonggi-Do (KR)

(72) Inventors: Hyo-Young Mun, Yongin-Si (KR); Young-Gu Kim, Yongin-Si (KR); Young-Ji Kim, Yongin-Si (KR); Hyun-Jun Cho, Yongin-Si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/681,222

(22) Filed: Aug. 18, 2017

(65) Prior Publication Data

US 2017/0346045 A1 Nov. 30, 2017

Related U.S. Application Data

(63) Continuation of application No. 13/941,448, filed on Jul. 12, 2013, now abandoned.

(30) Foreign Application Priority Data

Aug. 31, 2012 (KR) ........................ 10-2012-0096474
May 9, 2013 (KR) ........................ 10-2013-0052589

(51) Int. Cl.
*H01L 51/56* (2006.01)
*H01L 27/32* (2006.01)
(Continued)

(52) U.S. Cl.
CPC .............. *H01L 51/56* (2013.01); *C08J 7/047* (2013.01); *H01L 51/003* (2013.01);
(Continued)

(58) Field of Classification Search
None
See application file for complete search history.

(56) References Cited

U.S. PATENT DOCUMENTS

| 6,265,820 B1 * | 7/2001 | Ghosh | H01L 51/529 313/11 |
|---|---|---|---|
| 6,525,786 B1 | 2/2003 | Ono | |

(Continued)

FOREIGN PATENT DOCUMENTS

| CN | 2101357 U | 4/1992 |
|---|---|---|
| CN | 1622713 A | 6/2005 |

(Continued)

OTHER PUBLICATIONS

Extended European Search Report dated Dec. 13, 2013, for corresponding European Patent Application No. 13182271.0 (8 pages).

(Continued)

*Primary Examiner* — Nishath Yasmeen
(74) *Attorney, Agent, or Firm* — Lewis Roca Rothgerber Christie LLP

(57) ABSTRACT

A method for manufacturing an organic light emitting device includes: forming an organic light emitting display panel including a substrate provided on a support substrate, an organic light emitting element on the substrate, and a thin film encapsulating film covering the organic light emitting element; detaching the support substrate from the organic light emitting display panel; attaching a bottom protecting film to a bottom of the organic light emitting display panel, the bottom protecting film comprising a first electricity removing layer configured to remove static electricity; and cutting the organic light emitting display panel into a plurality of organic light emitting devices.

8 Claims, 18 Drawing Sheets

(51) Int. Cl.
*H01L 51/52* (2006.01)
*H01L 51/00* (2006.01)
*C08J 7/04* (2020.01)

(52) U.S. Cl.
CPC ........ *H01L 51/0097* (2013.01); *H01L 51/524* (2013.01); *H01L 51/5253* (2013.01); *C08J 2333/00* (2013.01); *C08J 2423/06* (2013.01); *H01L 27/3244* (2013.01); *H01L 51/529* (2013.01); *H01L 51/5256* (2013.01); *H01L 2251/5338* (2013.01); *H01L 2251/566* (2013.01); *Y02E 10/549* (2013.01); *Y02P 70/521* (2015.11)

(56) References Cited

U.S. PATENT DOCUMENTS

| | | | |
|---|---|---|---|
| 2002/0113248 A1 | 8/2002 | Yamagata et al. | |
| 2004/0209007 A1 | 10/2004 | Satake et al. | |
| 2004/0265757 A1 | 12/2004 | Taima | |
| 2005/0122042 A1* | 6/2005 | Kang | H01L 51/5237 313/506 |
| 2005/0258441 A1* | 11/2005 | Shitagami | H01L 27/0248 257/88 |
| 2006/0226523 A1* | 10/2006 | Foust | H01L 51/0097 257/680 |
| 2007/0077691 A1 | 4/2007 | Watanabe | |
| 2008/0211402 A1* | 9/2008 | DeCook | H01L 51/5237 313/511 |
| 2010/0148127 A1 | 6/2010 | Ellinger et al. | |
| 2010/0156763 A1* | 6/2010 | Lee | H01L 51/529 345/76 |
| 2010/0177397 A1 | 7/2010 | Kamiyama et al. | |
| 2010/0308335 A1 | 12/2010 | Kim et al. | |
| 2011/0025196 A1 | 2/2011 | Rakuff et al. | |
| 2011/0193478 A1 | 8/2011 | Kim | |
| 2011/0193748 A1 | 8/2011 | Kuo et al. | |
| 2012/0161197 A1 | 6/2012 | Im et al. | |

FOREIGN PATENT DOCUMENTS

| | | |
|---|---|---|
| CN | 1700823 A | 11/2005 |
| CN | 100362372 C | 1/2008 |
| CN | 101278398 A | 10/2008 |
| CN | 101443429 A | 5/2009 |
| CN | 101728420 A | 6/2010 |
| CN | 101908555 A | 12/2010 |
| CN | 102576819 A | 7/2012 |
| EP | 2259321 A1 | 12/2010 |
| JP | 08-137392 A | 5/1996 |
| JP | 09-249866 A | 9/1997 |
| JP | 2001-313164 A | 11/2001 |
| JP | 3533274 | 3/2004 |
| JP | 2004-207234 A | 7/2004 |
| JP | 2004-338379 A | 12/2004 |
| JP | 2005-158698 A | 6/2005 |
| JP | 2005-340058 A | 12/2005 |
| JP | 2006-004907 A | 1/2006 |
| JP | 2006-171454 A | 6/2006 |
| JP | 2007-123859 A | 5/2007 |
| JP | 2010-182668 A | 8/2010 |
| JP | 2010-282966 A | 12/2010 |
| JP | 2011-003522 A | 1/2011 |
| JP | 2011-123150 A | 6/2011 |
| KR | 10-2006-0085491 A | 7/2006 |
| KR | 10-0714017 | 4/2007 |
| KR | 20070121974 A | 12/2007 |
| KR | 10-0824966 B1 | 4/2008 |
| KR | 10-1003840 | 12/2010 |
| KR | 10-2012-0057881 | 6/2012 |
| KR | 10-1155907 | 6/2012 |
| TW | 200906615 | 2/2009 |
| TW | 201006873 | 2/2010 |
| TW | 201009059 A1 | 3/2010 |
| TW | 201044899 A1 | 12/2010 |
| WO | WO 2005/064993 A1 | 7/2005 |
| WO | WO 2008/020578 A1 | 2/2008 |
| WO | WO 2009/155190 A2 | 12/2009 |
| WO | WO 2011/014307 A1 | 2/2011 |

OTHER PUBLICATIONS

Korean Patent Abstracts Publication No. 10-2010-0130898 A, dated Dec. 14, 2010, for KR 10-1155907 listed above.
Patent Abstracts of Japan Publication No. 09-113726, dated May 2, 1997, for JP 3533274 listed above.
SIPO Office Action dated Jul. 29, 2016, for corresponding Chinese Patent Application No. 201310369989.9 (10 pages).
SIPO Office Action, with English translation, dated Feb. 14, 2017, for corresponding Chinese Patent Application No. 201310369989.9 (16 pages).
TIPO Office Action dated Dec. 13, 2016, for corresponding Taiwanese Patent Application No. 102128249 (11 pages).
EP Office Action for corresponding EP Application No. 13182271.0, dated Jun. 29, 2017 (5 pages).
JP Office Action for corresponding JP Application No. 2013-162533, dated May 9, 2017 (6 pages).

* cited by examiner

ORGANIC LIGHT EMITTING DEVICE AND MANUFACTURING METHOD THEREOF

CROSS-REFERENCE TO RELATED APPLICATION

This application is a continuation of U.S. patent application Ser. No. 13/941,448, filed in the United States Patent and Trademark Office on Jul. 12, 2013, which claims priority to and the benefit of Korean Patent Application Nos. 10-2012-0096474 and 10-2013-0052589 filed in the Korean Intellectual Property Office on Aug. 31, 2012 and May 9, 2013, the entire contents of which are incorporated herein by reference.

BACKGROUND

1. Field

The described technology relates generally to an organic light emitting device and a manufacturing method thereof.

2. Description of the Related Art

An organic light emitting diode (OLED) display includes a plurality of OLEDs including a hole injection electrode, an organic emission layer, and an electron injection electrode. Each OLED emits light by energy generated when excitons that are generated as electrons and holes are combined and change from an excited state to a ground state. The organic light emitting device can be used as a lighting device, and as a display device for displaying images (e.g., predetermined images).

The organic light emitting element may deteriorate due to external factors or forces such as external moisture, oxygen, or ultraviolet rays (UV), so packaging methods for encapsulating the organic light emitting element are important. In addition, the organic light emitting diode (OLED) display can be manufactured thin or flexible for various types of applications. In order to encapsulate the organic light emitting element and to form a thin and flexible organic light emitting diode (OLED) display, a thin film encapsulation (TFE) method has been developed. In thin film encapsulation, a display area is covered with a thin film encapsulation layer by alternately stacking an inorganic layer and an organic layer over the organic light emitting elements that are formed in the display area of the substrate. When the substrate of the organic light emitting diode (OLED) display including the thin film encapsulation layer is formed with a flexible film, it can be easily bent and can also be slim.

When a flexible film substrate is used, the substrate is mounted on a support substrate to support the organic light emitting device during the manufacturing process, including a planarizing process. However, when the substrate is detached from the support substrate, the thin, flexible substrate can be damaged.

Further, while the organic light emitting device having a flexible substrate is operated may encounter electrical problems that would not be expected in the organic light emitting device using a rigid substrate.

The above information disclosed in this Background section is only for enhancement of understanding of the background of the described technology and therefore it may contain information that does not form the prior art that is already known in this country to a person of ordinary skill in the art.

SUMMARY

Embodiments of the present invention have been made in an effort to provide an organic light emitting device for preventing or reducing the likelihood of a drive problem by preventing or reducing the likelihood of physical damage and removing or discharging static electricity of a substrate, and a manufacturing method thereof.

An exemplary embodiment provides an organic light emitting device including: a substrate; an organic light emitting element on the substrate; a thin film encapsulating film for covering the organic light emitting element; and a bottom protecting film attached to a bottom of the substrate, the bottom protecting film including a first electricity removing layer configured to remove static electricity.

The organic light emitting element may include: a gate line on the substrate and configured to transmit a scan signal; a data line and a driving voltage line crossing the gate line in an insulated manner and configured to transmit a data signal and a driving voltage, respectively; a switching thin film transistor connected to the gate line and the data line; a drive thin film transistor connected to the switching thin film transistor and the driving voltage line; a pixel electrode connected to the driving transistor; an organic light emitting member on the pixel electrode; and a common electrode on the organic light emitting member.

The substrate may be a flexible substrate.

The bottom protecting film may include a carrier film and an adhesive layer on the carrier film, and the first electricity removing layer may be provided between the substrate and the adhesive layer and contacts the substrate.

The bottom protecting film may further include a carrier film and an adhesive layer on the carrier film and contacting the substrate, and the carrier film and the adhesive layer may be provided between the substrate and the first electricity removing layer.

The bottom protecting film may further include a second electricity removing layer, a carrier film provided on the second electricity removing layer, and an adhesive layer on the carrier film, and the first electricity removing layer may be between the substrate and the adhesive layer.

The carrier film may include one of polyethylene terephthalate (PET), polyethylene naphthalate (PEN), polyethylene sulfide (PES), and polyethylene (PE).

The carrier film may be 25 μm to 300 μm thick.

The adhesive layer may be an acryl-based strong adhesive film.

Adhesiveness of the adhesive layer may be greater than 500 gf/inch when a substance to be adhered is stainless steel (SUS).

The organic light emitting device may further include at least one of a light blocking layer and heat dissipating plate between the carrier film and the adhesive layer.

Another embodiment provides a method for manufacturing an organic light emitting device, including: forming an organic light emitting display panel including a substrate provided on a support substrate, an organic light emitting element on the substrate, and a thin film encapsulating film covering the organic light emitting element; detaching the support substrate from the organic light emitting display panel; attaching a bottom protecting film to a bottom of the organic light emitting display panel, the bottom protecting film including a first electricity removing layer configured to remove static electricity; and cutting the organic light emitting display panel into a plurality of organic light emitting devices.

The substrate may be a flexible substrate.

The bottom protecting film may include a carrier film, an adhesive layer on the carrier film, and a first electricity removing layer on the adhesive layer, and the attaching of a bottom protecting film may include providing the bottom protecting film with a release film attached to the first electricity removing layer, and removing the release film from the bottom protecting film.

The bottom protecting film may further include a first electricity removing layer, a carrier film on the first electricity removing layer, and an adhesive layer on the carrier film, and the attaching of a bottom protecting film may include providing the bottom protecting film with a release film attached to the adhesive layer, and removing the release film from the bottom protecting film.

The bottom protecting film may further include a second electricity removing layer, a carrier film provided on the second electricity removing layer, an adhesive layer on the carrier film, and a first electricity removing layer on the adhesive layer, and the attaching of a bottom protecting film may include providing the bottom protecting film with a release film attached to the first electricity removing layer, and detaching the release film from the bottom protecting film.

The adhesive layer may be an acryl-based strong adhesive film.

Adhesiveness of the adhesive layer may be greater than 500 gf/inch when a substance to be adhered is stainless steel (SUS).

The method may further include forming a light blocking layer or a heat dissipating plate between the carrier film and the adhesive layer.

The method may further include attaching a top protecting film on a thin film encapsulating film of the organic light emitting display panel before detaching the support substrate from the organic light emitting display panel.

The method may further include cutting the organic light emitting display panel to separate it into a plurality of organic light emitting devices and removing the top protecting film.

DETAILED DESCRIPTION

Figure 1:
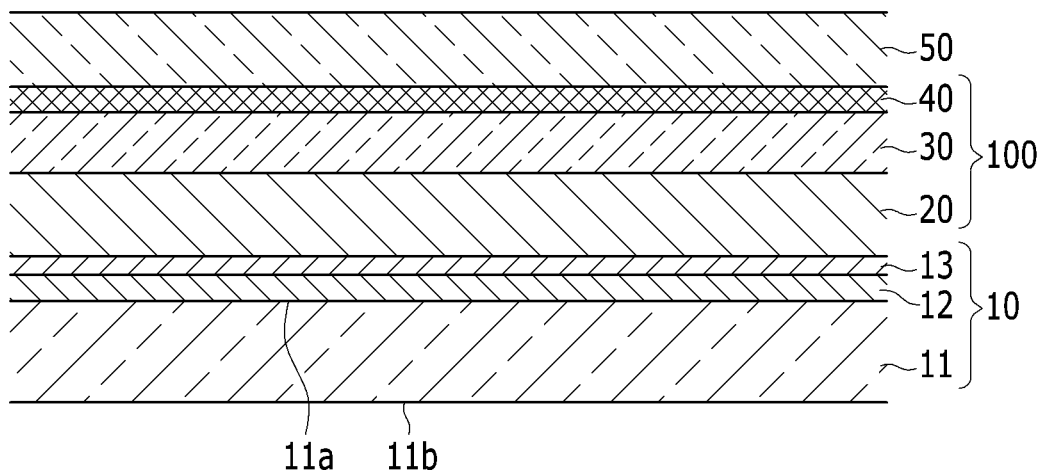
FIG. 1 shows a cross-sectional view of an organic light emitting device according to a first exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive, and like reference numerals designate like elements throughout the specification.

In addition, the size and thickness of each component shown in the drawings are arbitrarily shown for understanding and ease of description, but embodiments of the present invention are not limited thereto.

In the drawings, the thicknesses of layers, films, panels, regions, etc., are exaggerated for clarity. Further, the thicknesses of some layers and regions are exaggerated in the drawings for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, it will be understood that when an element such as a layer, film, region, or substrate is referred to as being "on" another element, it can be directly on the other element or intervening elements may also be present.

An organic light emitting device according to a first exemplary embodiment of the present invention will now be described with reference to FIGS. 1, 2, and 3.

Figure 2:
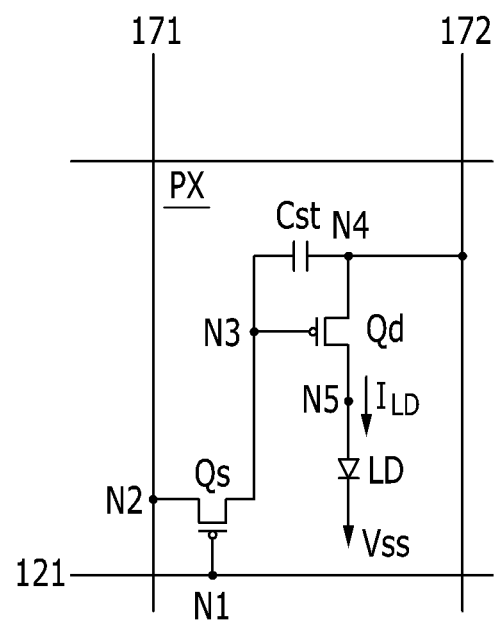
FIG. 2 shows an equivalent circuit of a pixel of an organic light emitting device according to the first exemplary embodiment.
Figure 3:
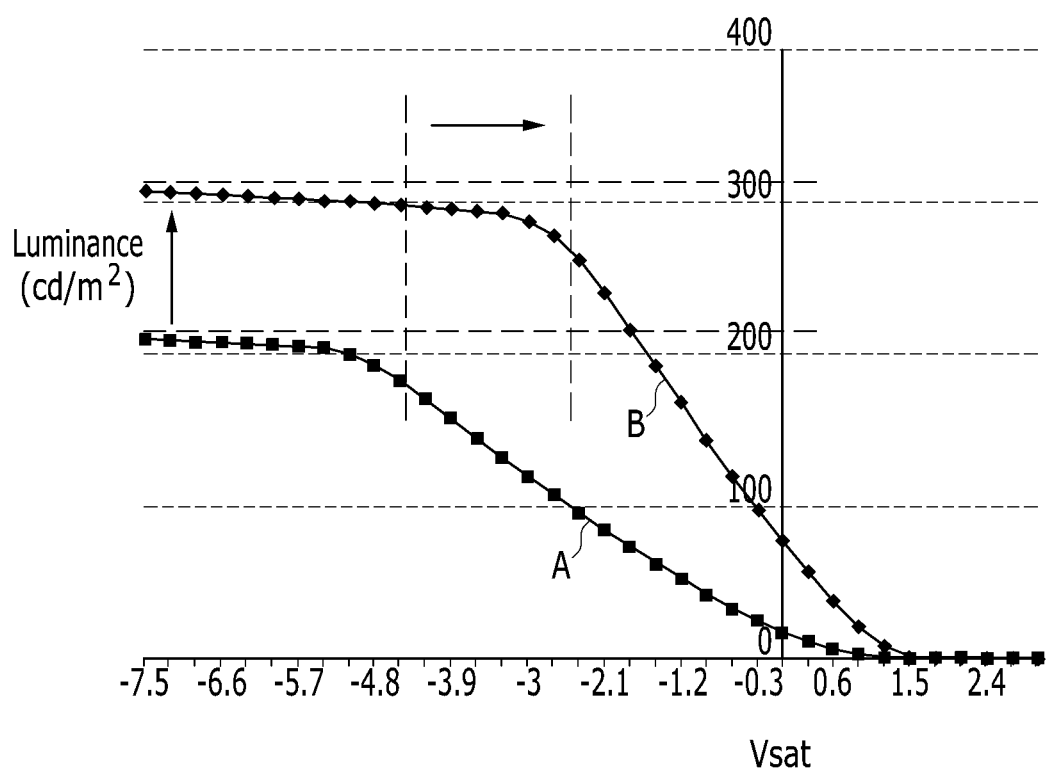
FIG. 3 shows a graph of luminance with respect to a driving voltage of an organic light emitting device including a bottom protecting film for a display device according to the first exemplary embodiment.

FIG. 1 shows a cross-sectional view of an organic light emitting device according to the first exemplary embodiment, FIG. 2 shows an equivalent circuit of a pixel of an organic light emitting device according to the first exemplary embodiment, and FIG. 3 shows a graph of a relation of luminance with respect to a driving voltage of an organic light emitting device including a bottom protecting film for a display device according to the first exemplary embodiment.

As shown in FIG. 1 and FIG. 2, the organic light emitting device includes an organic light emitting display panel 100 for displaying an image, and a bottom protecting film 10 attached below the organic light emitting display panel 100.

The organic light emitting display panel 100 includes a substrate 20, an organic light emitting element 30 formed on the substrate, a thin film encapsulating film 40 for covering the organic light emitting element, and a top protecting film 50 attached to the thin film encapsulating film 40.

The substrate 20 is a transparent substrate and can be a flexible substrate like a polymer film.

As shown in FIG. 2, the organic light emitting element 30 includes a plurality of signal lines 121, 171, and 172 and a pixel (PX) connected thereto. The pixel (PX) can be one of a red pixel (R), a green pixel (G), and a blue pixel (B). The signal line includes a scanning signal line 121 for transmitting a gate signal (or a scan signal), a data line 171 for transmitting a data signal, and a driving voltage line 172 for transmitting a driving voltage. The scan signal lines 121 substantially extend in a row direction and are substantially parallel with each other (e.g., substantially parallel other scan signal lines 121 coupled to other pixels PX in different rows), and the data lines 171 substantially extend in a column direction and are substantially parallel with each other (e.g., parallel with other data lines 171 coupled to other pixels PX in different columns). The driving voltage lines 172 are shown to substantially extend in a column direction, but embodiments of the present invention are not limited thereto and they can alternatively extend in the row direction or the column direction or formed as a mesh.

A pixel (PX) includes a thin film transistor including a switching transistor (Qs) and a driving transistor (Qd), a storage capacitor (Cst), and an organic light emitting element (LD). The pixel (PX) may further include a thin film transistor and capacitor so as to compensate (e.g., for variations in) the current supplied to the organic light emitting element.

The switching transistor (Qs) includes a control terminal N1, an input terminal N2, and an output terminal N3, and the control terminal N1 is connected to the scan signal line 121, the input terminal N2 is connected to the data line 171, and the output terminal N3 is connected to the driving transistor (Qd). The switching transistor (Qs) transmits the data signal provided by the data line 171 to the driving transistor (Qd) in response to the scan signal provided by the scan signal line 121.

The driving transistor (Qd) includes a control terminal N3, an input terminal N4, and an output terminal N5, and the control terminal N3 is connected to the switching transistor (Qs), the input terminal N4 is connected to the driving voltage line 172, and the output terminal N5 is connected to the organic light emitting element (LD). The driving transistor (Qd) outputs an output current ($I_{LD}$) that is varied or controlled by a voltage between the control terminal N3 and the output terminal N5.

The capacitor Cst is connected between the control terminal N3 and the input terminal N4 of the driving transistor (Qd). The capacitor Cst charges (or stores) the data signal applied to the control terminal N3 of the driving transistor (Qd) and maintains the charged or stored data signal when the switching transistor (Qs) is turned off.

The organic light emitting element (LD) is exemplarily an organic light emitting diode (OLED), and includes an anode connected to the output terminal N5 of the driving transistor (Qd) and a cathode connected to a voltage supply (Vss). The organic light emitting element (LD) displays an image by emitting light with intensity in accordance with the output current ($I_{LD}$) of the driving transistor (Qd). The organic light emitting element (LD) can include an organic material for emitting at least one of the primary colors (red, green and blue), and the organic light emitting device displays the desired image by a spatial sum of the colors of adjacent pixels PX.

At least one of the switching transistor (Qs) and the driving transistor (Qd) may be a p-channel field effect transistor. Also, the connections between the transistors (Qs, Qd), the capacitor Cst, and the organic light emitting element (LD) may differ in various embodiments of the present invention.

The thin film encapsulating film 40 faces the substrate 20 and protects the organic light emitting element 30 by preventing or blocking oxygen and moisture from entering from the outside.

The thin film encapsulating film 40 is formed by alternately stacking at least one organic layer and at least one inorganic layer.

According to embodiments of the present invention, the organic layer is formed with polymers, and can be a single layer or a stacked layer formed with one of polyethylene terephthalate, polyimide, polycarbonate, epoxy, polyethylene, and polyacrylate. In one embodiment, the organic layer can be formed with polyacrylate, and in more detail, it includes a polymerized monomer composition including a di-acrylate monomer and tri-acrylate monomer. A mono-acrylate monomer can be included in the monomer composition. A known photoinitiator such as TPO (2,4,6-Trimethylbenzoyl-diphenyl-phosphineoxide) can be further included in the monomer composition, but is not limited thereto.

The inorganic layer can be a single layer or a deposition layer including a metal oxide or a metal nitride. In more detail, the inorganic layer can include one of $SiN_x$, $Al_2O_3$, $SiO_2$, and $TiO_2$. The externally exposed uppermost layer of the thin film encapsulating film 40 can be formed with an inorganic layer so as to prevent or block permeation of vapor into the organic light emitting element 30.

In one embodiment, the thin film encapsulating film 40 can include one sandwich configuration in which one organic layer is inserted between at least two inorganic layers. In another embodiment, the thin film encapsulating film 40 can include at least one sandwich configuration in which at least one inorganic layer is included between at least two organic layers.

Also, the thin film encapsulating film 40 can sequentially include a first inorganic layer, a first organic layer, and a second inorganic layer in order from top to bottom of the organic light emitting element. In addition, thin film encapsulating film 40 can sequentially include a first inorganic layer, a first organic layer, a second inorganic layer, a second organic layer, and a third inorganic layer in order from top to bottom of the organic light emitting element. Further, the thin film encapsulating film 40 can sequentially include a first inorganic layer, a first organic layer, a second inorganic layer, a second organic layer, a third inorganic layer, a third organic layer, and a fourth inorganic layer in order from top to bottom of the organic light emitting element.

In one embodiment, a metal halide layer including LiF is included between the organic light emitting element and the first inorganic layer, and the metal halide layer prevents or protects the organic light emitting element from being damaged when the first inorganic layer is formed according to a sputtering method or a plasma deposition method.

The first organic layer can be narrower (or thinner) than the second inorganic layer, and the second organic layer can be narrower (or thinner) than the third inorganic layer. Further, the first organic layer can be entirely covered by the second inorganic layer, and the second organic layer can be entirely covered by the third inorganic layer.

The thin film encapsulating film 40 may be easily damaged through piercing or scratching by a foreign substance during the manufacturing process. The damage can appear as a defect such as a dark spot on the display. In order to prevent or reduce the likelihood of damage of the thin film encapsulating film 30, the top protecting film 50 is attached to the thin film encapsulating film 40.

The top protecting film 50 can include a carrier film, an adhesive layer, and a release film in a like manner of the bottom protecting film 10. Therefore, because the top protecting film 50 protects the thin film encapsulating film 40 during the manufacturing process, some conditions for performing the manufacturing process can be removed or relaxed.

The bottom protecting film 10 includes a carrier film 11, an adhesive layer 12 formed on the carrier film 11, and a first electricity removing layer 13 (or antistatic layer) attached to the adhesive layer 12 and configured to dissipate static electricity. The carrier film 11 includes a first side (11a) facing the adhesive layer 12 and a second side (11b) exposed to the outside.

The carrier film 11 can include one of polyethylene terephthalate (PET), polyethylene naphthalate (PEN), polyethylene sulfide (PES), and polyethylene (PE).

The carrier film 11 can be 25 µm to 300 µm thick. When the carrier film 11 is less than 25 µm thick, it is very thin and it may be difficult (or insufficient) to function as a bottom protecting film for protecting the bottom of the organic light emitting device, and when the carrier film 11 is thicker than 300 µm and the bottom protecting film for the display device is attached to the organic light emitting device, it is difficult for the organic light emitting device to be flexible (e.g., the flexibility of the organic light emitting device may be reduced).

The bottom protecting film 10 is permanently attached to the substrate, and therefore the adhesive layer 12 has strong adhesiveness. The bottom protecting film 10 is not peeled or detached during the manufacturing process, the adhesive layer 12 can be an acryl-based strong adhesive film, and when a material to be adhered is steel use stainless (SUS or stainless steel), the adhesiveness of the adhesive layer 12 can be greater than 500 gf/inch.

Under conditions in which repulsion resistance of the adhesive layer 12 is improved (or high) and the bottom protecting film 10 is bent, the substrate 20 of the organic light emitting display panel 100 is not separated from the bottom protecting film 10.

The first electricity removing layer 13 is formed with a conductive polymer material, for example, a poly3,4-ethylenedioxythiophene (PEDOT)-based material, and it is formed to be 20 nm to 100 nm thick by using a gravure coating method. When the first electricity removing layer 13 is thinner than 20 nm, it is difficult (or insufficient) to perform an electricity removing function for preventing static electricity, and when the first electricity removing layer 13 is thicker than 100 nm, the bottom protecting film 10 becomes thicker than desired. The first electricity removing layer 13 dissipates static electricity generated (or prevents electrostatic discharge) when the support substrate (see, e.g., 1 in FIG. 4) detached from the substrate 20, and prevents or reduces the likelihood of a drive problem occurring at the organic light emitting device due to a change of the characteristic of the thin film transistor of the organic light emitting device due to the discharge of static electricity.

The bottom protecting film 10 from which the release film (see 14 in FIG. 6) is detached is attached to the bottom of the substrate 20 of the organic light emitting display panel 100, and in more detail, the adhesive layer 12 and the first electricity removing layer 13 of the bottom protecting film 10 is attached to the substrate 20. The first electricity removing layer 13 partially covers the adhesive layer 12 so the adhesive layer 12 is attached to the substrate 20.

Accordingly, when the bottom protecting film 10 is attached to the bottom of the substrate 20, the substrate 20 does not directly contact the outside (or the external environment), thereby preventing or protecting against physical damage to the substrate 20 and allowing easy manipulation of the organic light emitting device.

Also, the first electricity removing layer 13 for removing static electricity is formed on the bottom protecting film 10 attached to the substrate 20 to thus prevent or reduce the likelihood of bad driving or display defects (e.g., a moiré or mura phenomenon that is a defect like a pattern of wave, stain or point, etc. generated in the screen) of the organic light emitting device 1000 caused by the static electricity generated when the support substrate is detached from the substrate 20. Therefore, generation of the mura phenomenon that generates a visual defect due to bad driving or display defects is prevented or the likelihood thereof is reduced.

FIG. 3 shows a comparative example graph (A) of luminance with respect to the driving voltage of an organic light emitting device in which a first electricity removing layer is not formed, and an exemplary embodiment graph (B) of luminance with respect to the driving voltage of an organic light emitting device in which a first electricity removing layer is formed according to a first exemplary embodiment of the present invention.

As shown in FIG. 3, a saturation driving voltage (Vsat) of the conventional organic light emitting device (A) which does not include a first electricity removing layer 13 is 4.5 V, and the saturation driving voltage of the organic light emitting device (B) having a first electricity removing layer 13 according to the first exemplary embodiment is 2.4 V (lower than 4.5 V) so the driving voltage during normal driving operations is reduced and power consumption is reduced.

Also, the luminance of the conventional organic light emitting device A at the saturation driving voltage is 210 $cd/m^2$, and the luminance of the organic light emitting device (B) having the first electricity removing layer 13 according to the first exemplary embodiment at the saturation driving voltage is 305 $cd/m^2$ so the luminance is increased by about 31%.

Accordingly, by forming the first electricity removing layer 13 on the bottom protecting film 10, the luminance of the organic light emitting device is improved and power consumption is reduced so the efficiency of the organic light emitting device is increased.

A method for manufacturing an organic light emitting device according to a first exemplary embodiment will now be described with reference to FIGS. 4, 5, 6, 7, 8, and 9.

FIGS. 4, 5, 6, 7, 8, and 9 sequentially show a method for manufacturing an organic light emitting device according to a first exemplary embodiment.

Figure 4:
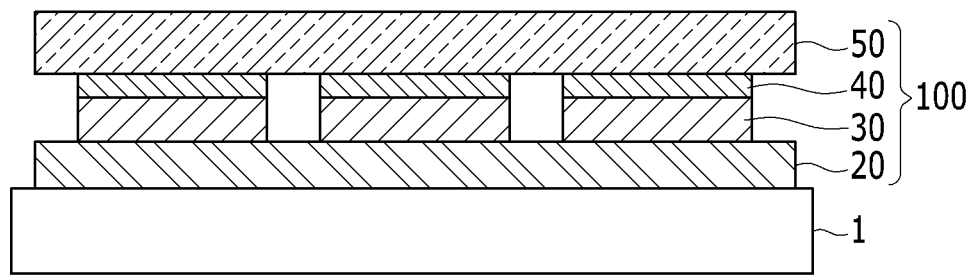
FIGS. 4, 5, 6, 7, 8, and 9 show a method for manufacturing an organic light emitting device according to the first exemplary embodiment.

As shown in FIG. 4, an organic light emitting display panel 100 is formed on a support substrate 1. The support substrate 1 is used to allow easy treatment or handling of the organic light emitting display panel 100. The organic light emitting display panel 100 includes a substrate 20, a plurality of organic light emitting elements 30 formed on the substrate 20 and separated (or spaced apart) from each other, and a plurality of thin film encapsulating films 40 covering the organic light emitting elements 30. A top protecting film 50 is attached to the thin film encapsulating films 40. As described, a plurality of organic light emitting elements 30 and a plurality of thin film encapsulating films 40 can be separably formed in the organic light emitting display panel 100. The organic light emitting display panel 100 is divided into a plurality of organic light emitting devices 100 after undergoing a process.

Figure 5:
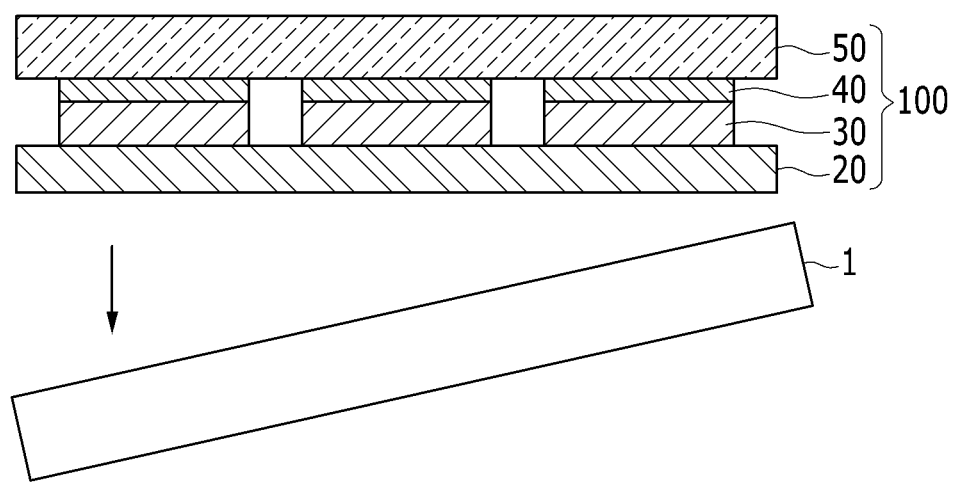

As shown in FIG. 5, the support substrate 1 is detached from the organic light emitting display panel 100. In this instance, static electricity may occur (or be developed) on the organic light emitting display panel 100 due to friction between the organic light emitting display panel 100 and the support substrate 1.

Figure 6:
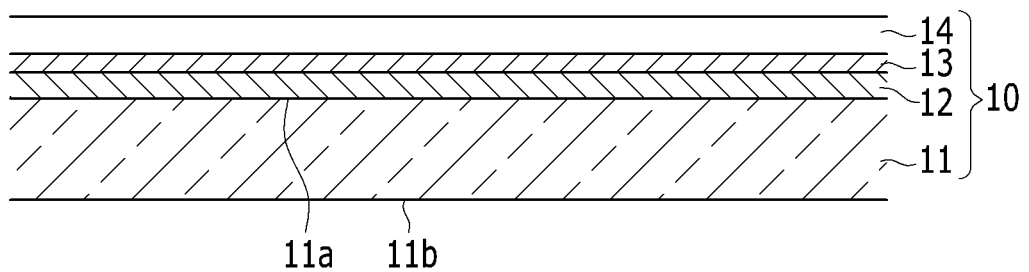

As shown in FIG. 6, a bottom protecting film 10 is provided. The bottom protecting film 10 includes a carrier film 11, an adhesive layer 12 formed on the carrier film 11, a release film 14 attached to the adhesive layer 12 and reducing or preventing fixedness of the adhesive layer 12, and a first electricity removing layer 13 formed between the adhesive layer 12 and the release film 14, the electricity removing layer 13 discharging or removing static electricity. The carrier film 11 includes a first side 11a and a second side 11b opposite to the first side 11a.

The release film 14 is a protecting film for preventing or reducing the likelihood of contamination and external contact of the adhesive layer 12, and it is removed before the bottom protecting film 10 is attached to be bottom of the substrate 20 of the organic light emitting display panel 100 so that the adhesive layer 12 may be easily attached to the bottom of the substrate 20.

When the release film 14 is detached from the adhesive layer 12, a strong adhesive film, the release film 14 can be damaged by the adhesive forces so the inner side of the release film 14 is coated with a 0.1 μm to 2 μm thick silicone layer by using a gravure coating method so that the release film 14 can be easily detached.

Figure 7:
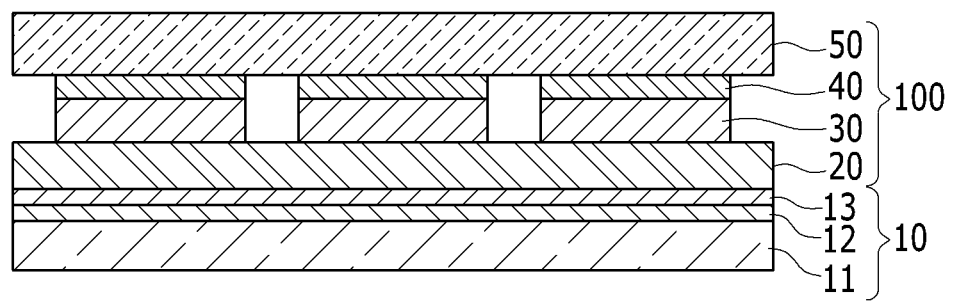

As shown in FIG. 7, the release film 14 is detached from the bottom protecting film 10, and the bottom protecting film 10 is attached to the bottom of the organic light emitting display panel 100. The bottom protecting film 10 is attached to the bottom of the substrate 20 of the organic light emitting display panel 100, and in more detail, the adhesive layer 12 and the first electricity removing layer 13 of the bottom protecting film 10 attached to the substrate 20. The adhesive layer 12 partially covers the first electricity removing layer 13 so the adhesive layer 12 can be attached to the substrate 20.

In this instance, the first electricity removing layer 13 discharges or removes static electricity generated below the substrate 20 of the organic light emitting display panel 100. Therefore, the change of the characteristic of the thin film transistor of the organic light emitting device caused by static electricity is prevented or reduced and thus prevents or reduces the likelihood of bad driving or display defects.

Figure 8:
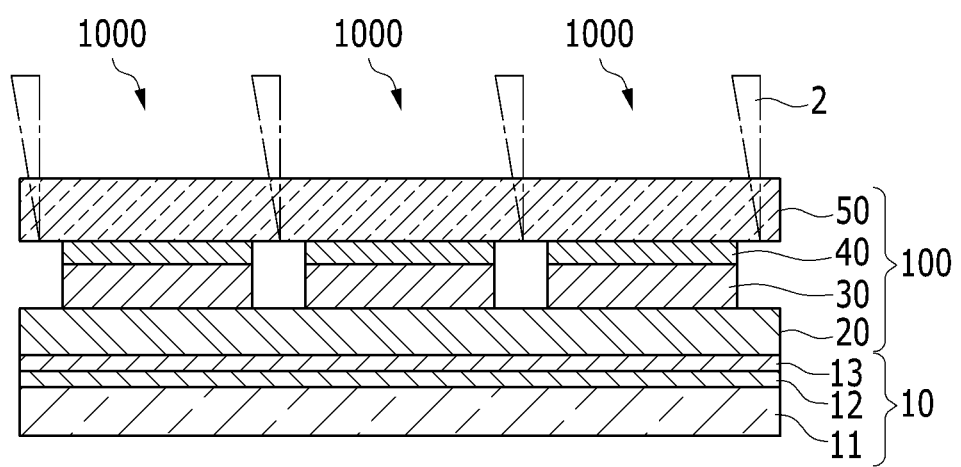

As shown in FIG. 8, a cutter 2 is used to cut the organic light emitting display panel 100 and the bottom protecting film 10 into a plurality of organic light emitting devices 1000.

Figure 9:
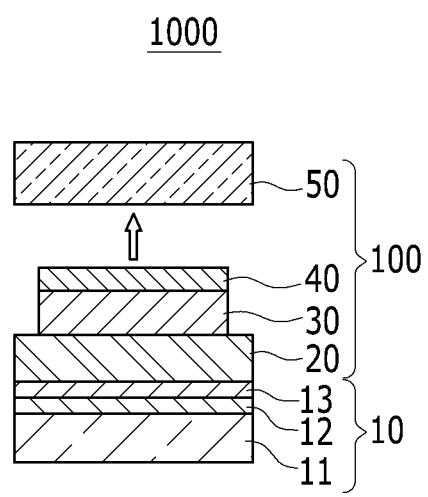

As shown in FIG. 9, the top protecting film 50 is removed to complete the organic light emitting device 1000.

The first electricity removing layer 13 is formed between the adhesive layer 12 and the release film 14 in the first exemplary embodiment, and it is also possible to form a second electricity removing layer on an external (or lower) surface of a carrier film and a third electricity removing layer on an external (or upper) surface of a release film according to a second exemplary embodiment.

An organic light emitting device according to a second exemplary embodiment of the present invention will now be described with reference to FIG. 10 and FIG. 11.

Figure 10:
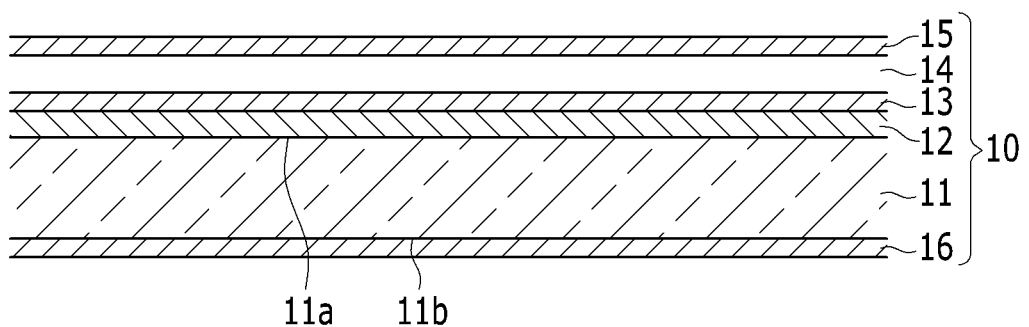
FIG. 10 shows a cross-sectional view of a bottom protecting film attached to an organic light emitting device according to a second exemplary embodiment of the present invention.
Figure 11:
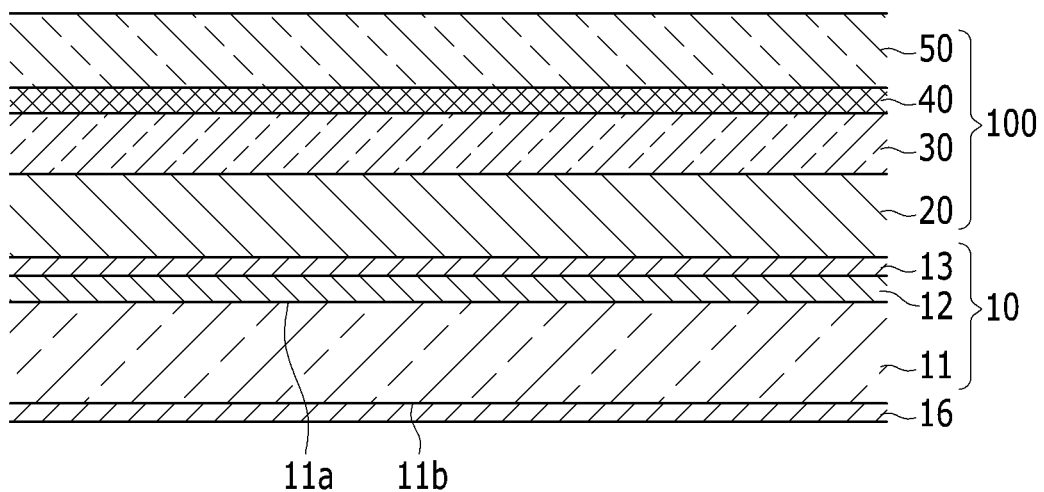
FIG. 11 shows a cross-sectional view of an organic light emitting device according to the second exemplary embodiment.

FIG. 10 shows a cross-sectional view of a bottom protecting film attached to an organic light emitting device according to a second exemplary embodiment, and FIG. 11 shows a cross-sectional view of an organic light emitting device according to the second exemplary embodiment.

The second exemplary embodiment is substantially similar to the first exemplary embodiment shown with reference to FIG. 1 except for the second electricity removing layer, and repeated description of substantially similar components will not be provided.

As shown in FIGS. 10 and 11, the bottom protecting film 10 attached to the organic light emitting device according to the second exemplary embodiment includes a carrier film 11, an adhesive layer 12 formed on the carrier film 11, a first electricity removing layer 13 attached to the adhesive layer 12, a release film 14 formed on the first electricity removing layer 13, a second electricity removing layer 16 formed on an external (or lower) surface of the carrier film 11, and a third electricity removing layer 15 formed on an external (or upper) surface of the release film 14. The second electricity removing layer 16 and the third electricity removing layer 15 are formed with a conductive polymer material, for example, a poly3,4-ethylenedioxythiophene (PEDOT)-based material, and it can be formed to be 20 nm to 100 nm thick by using a gravure coating method.

When the bottom protecting film 10 is attached to the organic light emitting display panel 100, the first electricity removing layer 13 removes or discharges static electricity from the substrate 20 to prevent the bad driving or display defects of the organic light emitting device caused by static electricity, and the second electricity removing layer 16 and the third electricity removing layer 15 prevent or discharge static electricity from being generated on the bottom protecting film 10 when the bottom protecting film 10 is loaded and transmitted.

As shown in FIG. 10, the organic light emitting device to which the bottom protecting film 10 is attached according to the second exemplary embodiment that includes an organic light emitting display panel 100 for displaying an image and a bottom protecting film 10 attached to the bottom of the organic light emitting display panel 100. The release film 14 is detached from the bottom protecting film 10 which is attached to the bottom of the substrate 20 of the organic light emitting display panel 100, and the bottom protecting film 10 includes a carrier film 11, an adhesive layer 12 formed on the carrier film 11, a first electricity removing layer 13 formed on the adhesive layer 12, and a second electricity removing layer 16 formed on an external (or lower) surface of the carrier film 11.

When the bottom protecting film 10 is attached to the organic light emitting display panel 100, the first electricity removing layer 13 removes static electricity from the substrate 20 to prevent or reduce the likelihood of the bad drive or display defects of the organic light emitting device caused by static electricity, and the second electricity removing layer 16 prevents or reduces the likelihood of static electricity being generated on the bottom protecting film 10 when the bottom protecting film 10 is loaded and moved.

A method for manufacturing an organic light emitting device according to a second exemplary embodiment will now be described with reference to FIG. 4, FIG. 5, FIG. 10, and FIG. 11.

As shown in FIG. 4, an organic light emitting display panel 100 is formed on the support substrate 1. The organic light emitting display panel 100 includes a substrate 20, an organic light emitting element 30 formed on the substrate, a thin film encapsulating film 40 for covering the organic light emitting element 30, and a top protecting film 50 attached to the thin film encapsulating film 40.

As shown in FIG. 5, a support substrate 1 is detached from the organic light emitting display panel 100. In this instance, static electricity may be generated on the substrate 20 of the organic light emitting display panel 100 by the friction between the organic light emitting display panel 100 and the support substrate 1.

A bottom protecting film 10 as shown in FIG. 10 can be made or manufactured. According to one embodiment, the bottom protecting film 10 is made by forming an adhesive layer 12 on the carrier film 11, forming a first electricity removing layer 13 on the adhesive layer 12, attaching a release film 14 to the first electricity removing layer 13, forming a second electricity removing layer 16 on an external (or lower) surface of the carrier film 11, and forming a third electricity removing layer 15 on the release film 14.

As shown in FIG. 11, the release film 14 is detached from the bottom protecting film 10, and the bottom protecting film 10 is attached to the bottom of the organic light emitting display panel 100. In this instance, the first electricity removing layer 13 removes or discharges the static electricity generated on the bottom of the substrate 20 of the organic light emitting display panel 100. Therefore, the bad drive or display defects (e.g., the moiré phenomenon that is a defect generated in the screen) of the organic light emitting device by static electricity can be prevented or the likelihood of such a defect occurring is reduced.

The first electricity removing layer 13 for removing static electricity is formed on the bottom protecting film 10 in the first exemplary embodiment, and it is possible to form a light blocking layer between a carrier film and an adhesive layer according to a third exemplary embodiment.

An organic light emitting device according to a third exemplary embodiment of the present invention will now be described with reference to FIG. 12 and FIG. 13.

Figure 12:
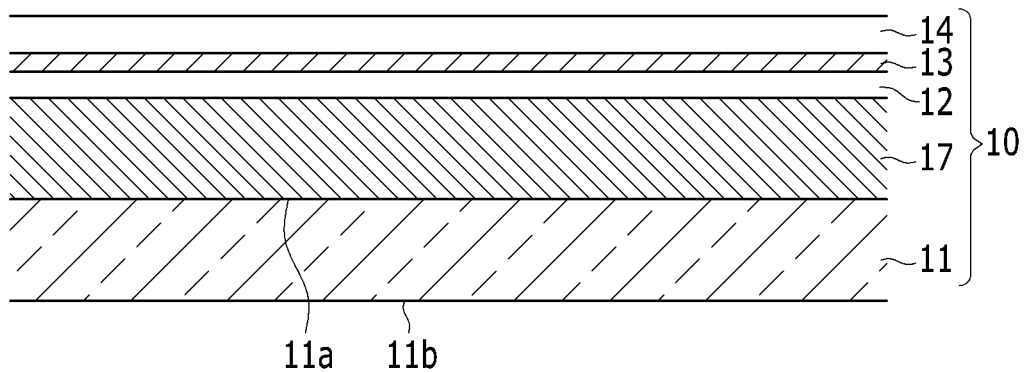
FIG. 12 shows a cross-sectional view of a bottom protecting film attached to an organic light emitting device according to a third exemplary embodiment of the present invention.
Figure 13:
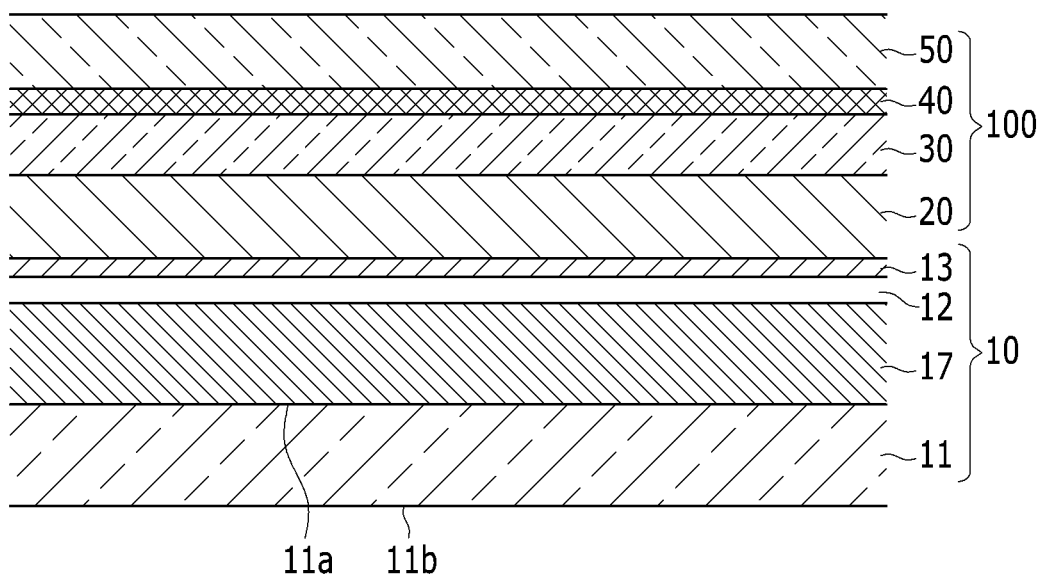
FIG. 13 shows a cross-sectional view of an organic light emitting device according to the third exemplary embodiment.

FIG. 12 shows a cross-sectional view of a bottom protecting film attached to an organic light emitting device according to a third exemplary embodiment, and FIG. 13 shows a cross-sectional view of an organic light emitting device according to a third exemplary embodiment.

The third exemplary embodiment is substantially equivalent to the first exemplary embodiment shown with reference to FIG. 1 except for an addition of the light blocking layer, so repeated description of substantially similar components will not be provided.

As shown in FIG. 12, the bottom protecting film 10 attached to the organic light emitting device according to the third exemplary embodiment includes a carrier film 11, a light blocking layer 17 formed on the carrier film 11, an adhesive layer 12 formed on the light blocking layer, a first electricity removing layer 13 attached to the adhesive layer 12, and a release film 14 formed on the first electricity removing layer 13.

As shown in FIG. 13, the organic light emitting device to which the bottom protecting film 10 is attached according to the third exemplary embodiment includes an organic light emitting display panel 100 for displaying an image, and a bottom protecting film 10 attached to the bottom of the organic light emitting display panel 100. The bottom protecting film 10 includes a carrier film 11, a light blocking layer 17 formed on the carrier film 11, an adhesive layer 12 formed on the light blocking layer 17, and a first electricity removing layer 13 attached to the adhesive layer 12 and removing or discharging static electricity. The release film 14 is detached from the bottom protecting film 10 which is attached to the bottom of the substrate 20 of the organic light emitting display panel 100, and, in more detail, the adhesive layer 12 and the first electricity removing layer 13 of the bottom protecting film 10 are attached to the substrate 20. The first electricity removing layer 13 partially covers the adhesive layer 12 so the adhesive layer 12 can be attached to the substrate 20.

Here, the light blocking layer 17 prevents or blocks external light from being reflected from the organic light emitting display panel 100 to prevent the bottom of the organic light emitting display panel 100 from reflecting light or to reduce reflections from the bottom of the organic light emitting display panel 100. Further, the light blocking layer 17 is formed on the bottom protecting film 10 without attaching an additional light blocking film, thereby reducing the thickness of the organic light emitting display panel 100 (e.g., when compared with conventional organic light emitting display panels) and simplifying the manufacturing process.

The light blocking layer 17 is formed between the carrier film 11 and the adhesive layer 12 in the third exemplary embodiment, and, in some embodiments, a heat dissipating plate is formed between the carrier film and the adhesive layer according to the fourth exemplary embodiment.

An organic light emitting device according to a fourth exemplary embodiment of the present invention will now be described with reference to FIG. 14 and FIG. 15.

Figure 14:
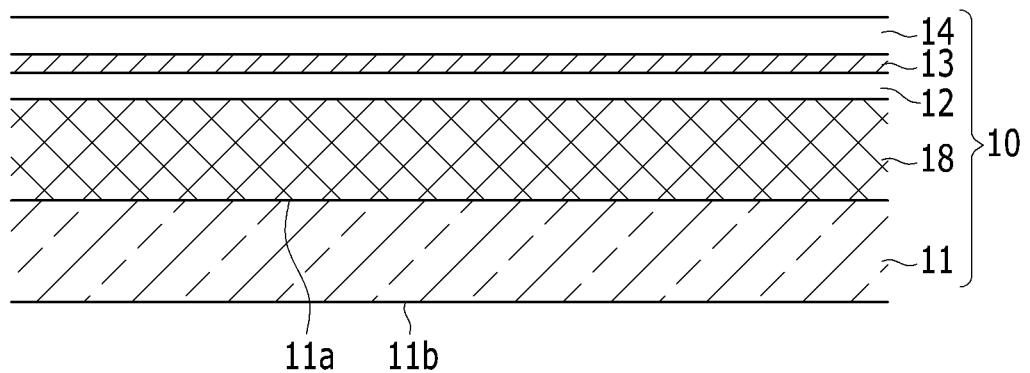
FIG. 14 shows a cross-sectional view of a bottom protecting film attached to an organic light emitting device according to a fourth exemplary embodiment of the present invention.
Figure 15:
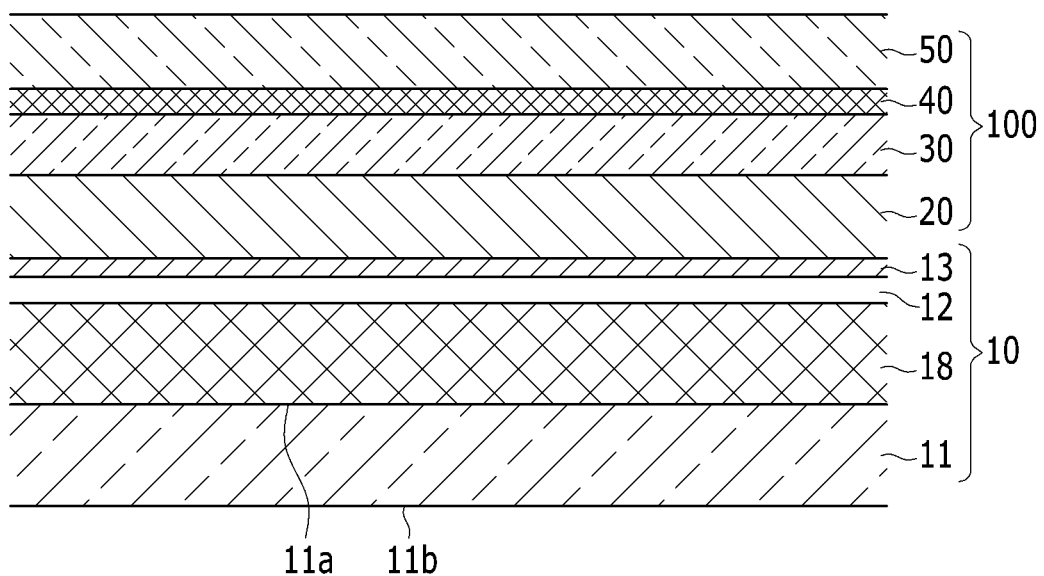
FIG. 15 shows a cross-sectional view of an organic light emitting device according to the fourth exemplary embodiment.

FIG. 14 shows a cross-sectional view of a bottom protecting film 10 that can be attached to an organic light emitting device according to the fourth exemplary embodiment, and FIG. 15 shows a cross-sectional view of an organic light emitting device according to the fourth exemplary embodiment.

The fourth exemplary embodiment is substantially similar to the third exemplary embodiment shown with reference to FIG. 12 and FIG. 13 except for formation of the heat dissipating plate, so repeated description of substantially similar components will be omitted.

As shown in FIG. 14, the bottom protecting film 10 attached to the organic light emitting device according to the fourth exemplary embodiment includes a carrier film 11, a heat dissipating plate 18 formed on the carrier film 11, an adhesive layer 12 formed on the heat dissipating plate 18, a first electricity removing layer 13 attached to the adhesive layer 12, and a release film 14 formed on the first electricity removing layer 13. Also, as shown in FIG. 15, the organic light emitting device according to the fourth exemplary embodiment includes an organic light emitting display panel 100 for displaying an image, and a bottom protecting film 10 attached to the bottom of the organic light emitting display panel 100. The bottom protecting film 10 includes a carrier film 11, a heat dissipating plate 18 formed on the carrier film 11, an adhesive layer 12 formed on the heat dissipating plate 18, and a first electricity removing layer 13 attached to the adhesive layer 12 and removing static electricity. The release film 14 is detached from the bottom protecting film 10 which is attached to the bottom of the substrate 20 of the organic light emitting display panel 100, and in more detail, the adhesive layer 12 and the first electricity removing layer 13 of the bottom protecting film 10 are attached to the substrate 20. The first electricity removing layer 13 partially covers the adhesive layer 12 so the adhesive layer 12 can be attached to the substrate 20.

Here, the heat dissipating plate 18 allows the heat generated by the organic light emitting display panel 100 to be easily discharged or dissipated to the outside to improve the life-span of the organic light emitting device and to reduce image sticking caused by heat generation. Also, the heat dissipating plate 18 is formed on the bottom protecting film 10 without additional attachment of a heat dissipating film, thereby reducing the thickness of the organic light emitting display panel 100 (e.g., when compared with a conventional organic light emitting display panel) and simplifying the manufacturing process.

Figure 18:
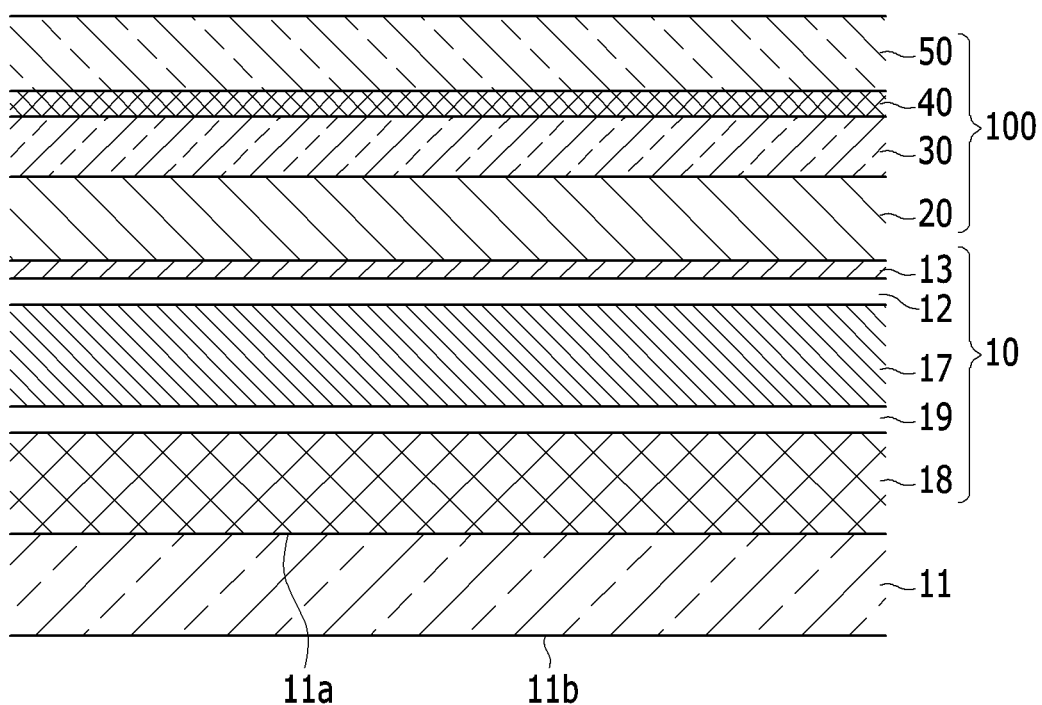
FIG. 18 shows a cross-sectional view of an organic light emitting device according to a seventh exemplary embodiment of the present invention.

In addition, the heat dissipating plate 18 may be disposed at a bottom of the light blocking layer 17 as shown in FIG. 18. For such structure, an additional adhesive layer 19 may be disposed between the light blocking layer 17 and the heat dissipating plate 18.

The second electricity removing layer is formed on an external (or lower) surface of the carrier film and the third electricity removing layer is formed on an external (or upper) surface of the release film in the second exemplary embodiment, and it is also possible to form a second electricity removing layer on an external (or lower) surface of the carrier film according to a fifth exemplary embodiment.

An organic light emitting device according to a fifth exemplary embodiment will now be described with reference to FIG. 16.

Figure 16:
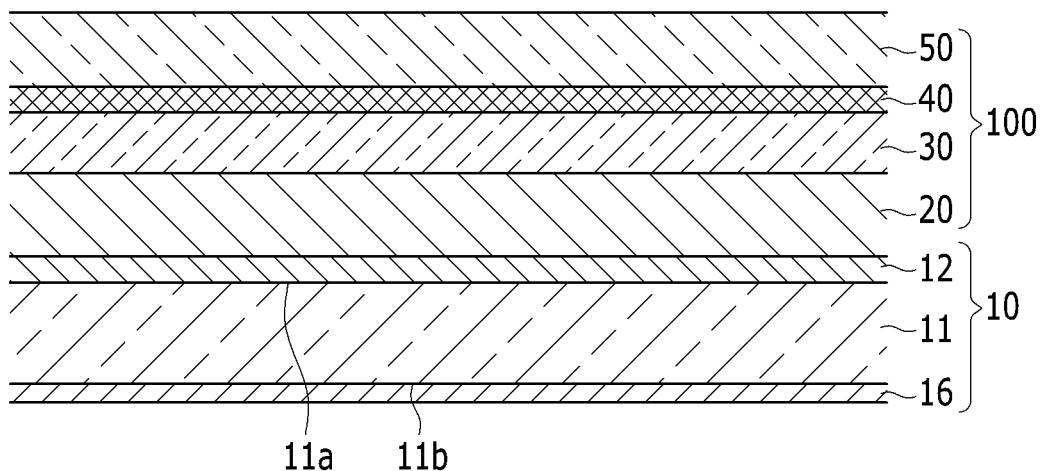
FIG. 16 shows a cross-sectional view of an organic light emitting device according to a fifth exemplary embodiment of the present invention.

FIG. 16 shows a cross-sectional view of an organic light emitting device according to a fifth exemplary embodiment.

The fifth exemplary embodiment is substantially similar to the second exemplary embodiment shown with reference to FIG. 11 except for formation of the second electricity removing layer, so repeated description of substantially similar components will be omitted.

As shown in FIG. 16, the organic light emitting device according to the fifth exemplary embodiment includes an organic light emitting display panel 100 for displaying an image, and a bottom protecting film 10 attached to the bottom of the organic light emitting display panel 100. The release film 14 is detached from the bottom protecting film 10 which is attached to the bottom of the substrate 20 of the organic light emitting display panel 100, and it includes a second electricity removing layer 16, a carrier film 11 formed on the second electricity removing layer 16, and an adhesive layer 12 formed on the carrier film 11.

The second electricity removing layer 16 can prevent or reduce or discharge static electricity being generated on the bottom protecting film 10 when the bottom protecting film 10 is loaded and moved.

A method for manufacturing an organic light emitting device according to a fifth exemplary embodiment will now be described with reference to FIG. 4, FIG. 5, and FIG. 16.

As shown in FIG. 4, an organic light emitting display panel 100 is formed on a support substrate 1. The organic light emitting display panel 100 includes a substrate 20, an organic light emitting element 30 formed on the substrate 20, a thin film encapsulating film 40 for covering the organic light emitting element 30, and a top protecting film 50 attached to the thin film encapsulating film 40.

As shown in FIG. 5, the support substrate 1 is detached from the organic light emitting display panel 100. In this instance, static electricity may occur on the substrate 20 of the organic light emitting display panel 100 by friction between the organic light emitting display panel 100 and the support substrate 1.

As shown in FIG. 16, a bottom protecting film 10 according to one embodiment of the present invention is provided. The bottom protecting film 10 is manufactured by forming an adhesive layer 12 on the carrier film 11, attaching a release film 14 to the adhesive layer 12, and forming a second electricity removing layer 16 on an external (or lower) surface of the carrier film 11. The release film 14 is detached from the bottom protecting film 10, and the bottom protecting film 10 is attached to the bottom of the organic light emitting display panel 100. In this instance, the second electricity removing layer 16 prevents static electricity from being generated (or discharges static electricity) on the bottom protecting film 10 when the bottom protecting film 10 is loaded and moved.

The 2tr-1cap-structured organic light emitting element 30 is included in the first preferred embodiment, and a sixth preferred embodiment including a 6tr-1cap-structured organic light emitting element 30 is also possible in embodiments of the present invention.

An organic light emitting device according to a sixth embodiment will now be described in more detail with reference to FIG. 17.

Figure 17:
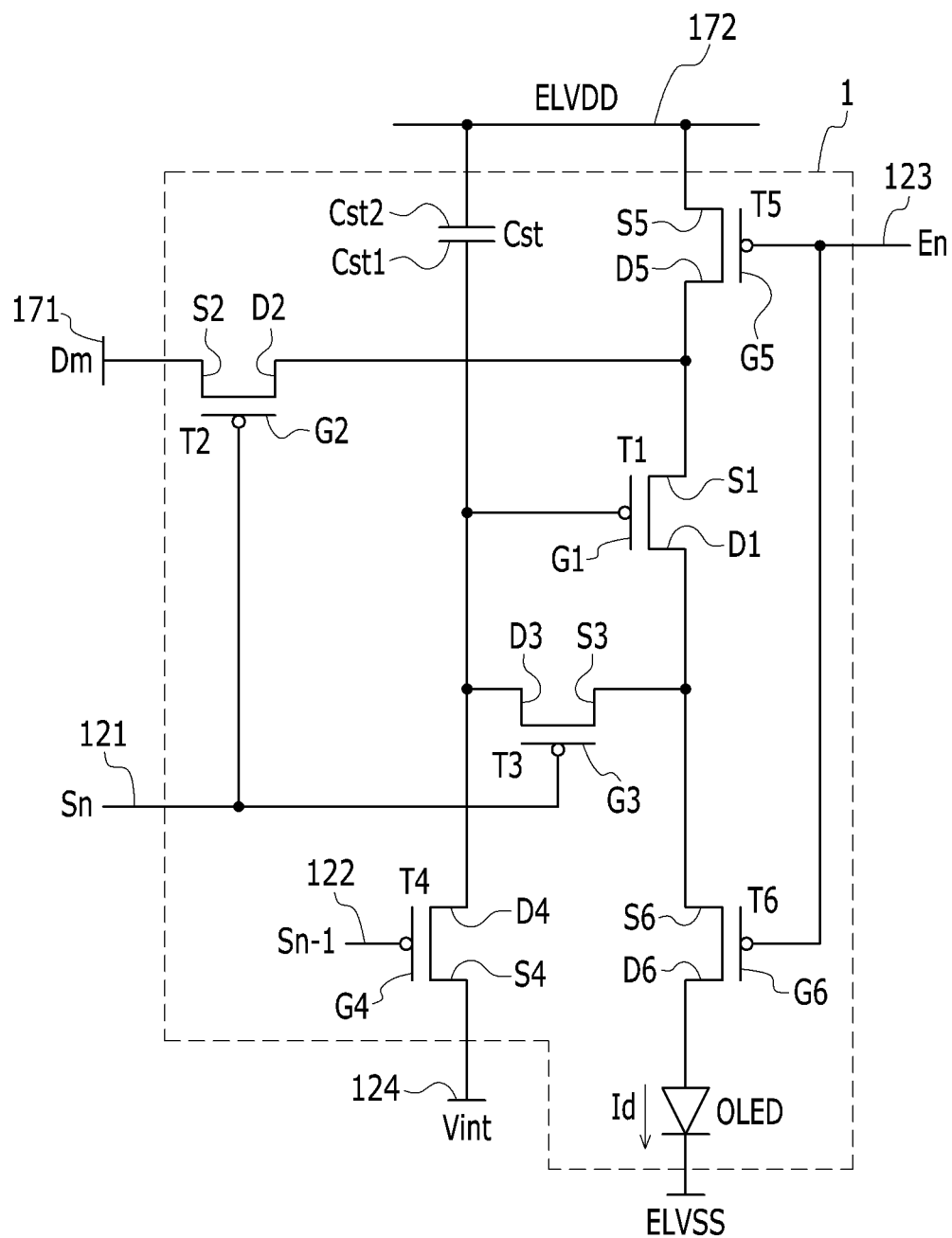
FIG. 17 shows an equivalent circuit diagram of a pixel of an organic light emitting device according to a sixth exemplary embodiment of the present invention.

FIG. 17 shows an equivalent circuit diagram of a pixel of an organic light emitting device according to a sixth embodiment.

The sixth embodiment is substantially similar with the first embodiment shown with FIG. 1 and FIG. 2 except for the organic light emitting element, and repeated description of substantially similar components will not be provided.

As shown in FIG. 17, the pixel 1 of the organic light emitting element 30 of the organic light emitting device includes: a plurality of signal lines 121, 122, 123, 124, 171, and 172; a plurality of transistors T1, T2, T3, T4, T5, and T6 connected to the signal lines; a storage capacitor Cst; and an organic light emitting diode (OLED).

The transistors include: a driving thin film transistor T1, a switching thin film transistor T2, a compensation thin film transistor T3, an initialization thin film transistor T4, an operation control thin film transistor T5, and a light emission control thin film transistor T6.

The signal lines include: a scan line 121 for transmitting a scan signal Sn, a prior scan line 122 for transmitting a prior scan signal Sn—1 to the initialization transistor T4, a light emission control line 123 for transmitting a light emission control signal En to the operation control transistor T5 and the light emission control transistor T6, a data line 171 crossing the scan line 121 and transmitting a data signal Dm, a driving voltage line 172 transmitting a driving voltage ELVDD and extending along a direction substantially parallel to the data line 171, and an initialization voltage line 124 for transmitting an initialization voltage Vint for initializing the driving transistor T1.

A gate electrode G1 of the driving transistor T1 is connected to an end (or a first plate) Cst1 of the storage capacitor Cst, a source electrode S1 of the driving transistor T1 is connected via the operation control transistor T5 to the driving voltage line 172, and a drain electrode D1 of the driving transistor T1 is electrically connected via the light emission control transistor T6 to an anode of the organic light emitting diode (OLED). The driving transistor T1 receives the data signal Dm according to a switching operation of the switching transistor T2 to supply a driving current Id to the organic light emitting diode (OLED).

A gate electrode G2 of the switching transistor T2 is connected to the scan line 121, a source electrode S2 of the switching transistor T2 is connected to the data line 171, and a drain electrode D2 of the switching transistor T2 is connected via the operation control transistor T5 to the driving voltage line 172 while being connected to the source electrode S1 of the driving transistor T1. The switching transistor T2 is turned on according to the scan signal Sn provided through the scan line 121 to perform a switching operation for transmitting the data signal Dm transmitted to the data line 171 to the source electrode of the driving transistor T1

A gate electrode G3 of the compensation transistor T3 is connected to the scan line 121, a source electrode S3 of the compensation transistor T3 is connected via the light emission control transistor T6 to the anode of the organic light emitting diode (OLED) while being connected to the drain electrode D1 of the driving transistor T1, and a drain electrode D3 of the compensation transistor T3 is connected to an end Cst1 of the storage capacitor Cst, a drain electrode D4 of the initialization transistor T4, and the gate electrode G1 of the driving transistor T1. The compensation transistor T3 is turned on according to the scan signal Sn provided through the scan line 121 to connect the gate electrode G1 and the drain electrode D1 of the driving transistor T1 and thus diode-connect the driving transistor T1.

A gate electrode G4 of the initialization transistor T4 is connected to the prior scan line 122, the source electrode S4 of the initialization transistor T4 is connected to the initialization voltage line 124, and the drain electrode D4 of the initialization transistor T4 is connected to the end Cst1 of the storage capacitor Cst, the drain electrode D3 of the compensation transistor T3, and the gate electrode G1 of the driving transistor T1. The initialization transistor T4 is turned on according to the prior scan signal Sn—1 provided through the prior scan line 122 to transmit the initialization voltage Vint to the gate electrode G1 of the driving transistor T1 to thus perform an initialization operation for initializing the voltage of the gate electrode G1 of the driving transistor T1.

A gate electrode G5 of the operation control transistor T5 is connected to the light emission control line 123, a source electrode S5 of the operation control transistor T5 is connected to the driving voltage line 172, and a drain electrode D5 of the operation control transistor T5 is connected to the source electrode S1 of the driving transistor T1 and the drain electrode S2 of the switching transistor T2.

A gate electrode G6 of the light emission control transistor T6 is connected to the light emission control line 123, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the organic light emitting diode (OLED). The operation control transistor T5 and the light emission control transistor T6 are turned on according to the light emission control signal En provided through the light emission control line 123 to transmit the driving voltage ELVDD to the organic light emitting diode (OLED) and allow the driving current Id to flow to the organic light emitting diode (OLED).

Another end (or a second plate) Cst2 of the storage capacitor Cst is connected to the driving voltage line 172, and a cathode of the organic light emitting diode (OLED) is connected to a common voltage ELVSS. Accordingly, the organic light emitting diode (OLED) receives the driving current Id from the driving transistor T1 to emit light, thereby displaying an image.

A specific operation process of a pixel of the organic light emitting device according to the sixth exemplary embodiment will now be described in more detail.

First, the prior scan signal Sn—1 at a low level is supplied through the prior scan line 122 during an initialization period. Then, the initialization transistor T4 is turned on in accordance with the prior scan signal Sn—1 at the low level, and the initialization voltage Vint is supplied to the gate electrode of the driving transistor T1 from the initialization voltage line 124 through the initialization transistor T4, and the driving transistor T1 is initialized by the initialization voltage Vint.

Subsequently, the scan signal Sn at the low level is supplied through the scan line 121 during a data programming period. Then, the switching transistor T2 and the compensation transistor T3 are turned on in accordance with the scan signal Sn at the low level.

In this instance, the driving transistor T1 is diode-connected by the turned-on compensation transistor T3, and is biased in a forward direction.

Then, a compensation voltage Dm+Vth (Vth is a negative value) obtained by subtracting a threshold voltage Vth of the driving transistor T1 from the data signal Dm supplied from the data line 171 is applied to the gate electrode of the driving transistor T1.

The driving voltage ELVDD and the compensation voltage Dm+Vth are respectively applied to opposing ends of the storage capacitor Cst, and charge corresponding to a voltage difference between both the ends is stored in the storage capacitor Cst. Thereafter, the level of the light emission control signal En supplied from the light emission control line 123 during the light emission period is changed from the high level to the low level. Then, the operation control transistor T5 and the light emission control transistor T6 are turned on by the light emission control signal En at the low level during the light emission period.

Then, the driving current Id is generated in accordance with a difference between the voltage of the gate electrode of the driving transistor T1 and the driving voltage ELVDD, and the driving current Id is supplied to the organic light emitting diode (OLED) through the light emission control transistor T6. A gate-source voltage Vgs of the driving transistor T1 is maintained at (Dm+Vth)-ELVDD by the storage capacitor Cst during the light emission period, and the driving current Id is proportional to a square of a value obtained by subtracting the threshold voltage from a source-gate voltage, $(Dm-ELVDD)^2$ according to a current-voltage relationship of the driving transistor T1. Accordingly, the driving current Id is determined (or can be controlled) in a manner that is substantially independent of the threshold voltage Vth of the driving transistor T1.

The organic light emitting device according to one exemplary embodiment attaches a bottom protecting film to the substrate to prevent or reduce the likelihood of physical damage to the substrate.

Also, the first electricity removing layer for removing static electricity is formed on the bottom protecting film to prevent or reduce the likelihood of a drive problem caused by a change of the characteristic of the thin film transistor of the organic light emitting device caused by the static electricity generated when the support substrate is detached from the substrate.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device comprising:
   a flexible substrate;
   an organic light emitting element on the flexible substrate in a display area of the flexible substrate;
   a thin film encapsulating film covering the organic light emitting element; and
   a bottom protecting film attached to a bottom of the flexible substrate, the bottom protecting film comprising a light blocking layer for blocking external light, an adhesive layer between the light blocking layer and the flexible substrate, a heat dissipating plate, and an additional adhesive layer between the heat dissipating plate and the light blocking layer,
   wherein the heat dissipating plate and the light blocking layer directly contact the additional adhesive layer in a region overlapping the display area along a direction perpendicular to the display area.

2. The organic light emitting device of claim 1, wherein the organic light emitting element comprises:
   a gate line on the flexible substrate and configured to transmit a scan signal;
   a data line and a driving voltage line crossing the gate line in an insulated manner and configured to transmit a data signal and a driving voltage, respectively;
   a switching thin film transistor connected to the gate line and the data line;
   a driving thin film transistor connected to the switching thin film transistor and the driving voltage line;
   a pixel electrode connected to the driving thin film transistor;
   an organic light emitting member on the pixel electrode; and
   a common electrode on the organic light emitting member.

3. The organic light emitting device of claim 1, wherein the bottom protecting film further comprises a carrier film, and
   wherein the adhesive layer is on the carrier film.

4. The organic light emitting device of claim 3, wherein the bottom protecting film further comprises a first electricity removing layer configured to remove static electricity, the bottom protecting film being between the flexible substrate and the adhesive layer.

5. The organic light emitting device of claim 3, wherein the carrier film comprises one of polyethylene terephthalate (PET), polyethylene naphthalate (PEN), polyethylene sulfide (PES), and polyethylene (PE).

6. The organic light emitting device of claim 3, wherein the carrier film is 25 μm to 300 μm thick.

7. The organic light emitting device of claim 1, wherein the adhesive layer is an acryl-based strong adhesive film.

8. The organic light emitting device of claim 7, wherein adhesiveness of the adhesive layer is greater than 500 gf/inch when a substance to be adhered is stainless steel (SUS).

* * * * *